United States Patent
Lee et al.

(10) Patent No.: US 6,294,456 B1
(45) Date of Patent: Sep. 25, 2001

(54) METHOD OF PREFILLING OF KEYHOLE AT THE TOP METAL LEVEL WITH PHOTORESIST TO PREVENT PASSIVATION DAMAGE EVEN FOR A SEVERE TOP METAL RULE

(75) Inventors: Yu-Hua Lee, Hsinchu; Min-Hsiung Chiang, Taipei; Jenn Ming Huang, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/200,589

(22) Filed: Nov. 27, 1998

(51) Int. Cl.⁷ ................................................. H01L 21/4763
(52) U.S. Cl. .......................... 438/623; 438/624; 438/631; 438/699; 438/704
(58) Field of Search ..................................... 438/623, 631, 438/626, 697, 958, 699, 704, 725, 624

(56) References Cited

U.S. PATENT DOCUMENTS

| | | | |
|---|---|---|---|
| 4,654,113 | * 3/1987 | Tuchiya et al. | 156/643 |
| 4,778,739 | 10/1988 | Protschka | 430/30 |
| 5,567,660 | 10/1996 | Chen et al. | 437/231 |
| 5,665,657 | 9/1997 | Lee | 438/624 |
| 5,837,618 | * 11/1998 | Avanzino et al. | 438/778 |
| 6,025,272 | * 2/2000 | Yu et al. | 438/697 |

OTHER PUBLICATIONS

Wolf et al., "Silicon Processing for the VLSI Era; vol. 1—Process Technology", Lattice Press, 1986, p. 518.*

* cited by examiner

Primary Examiner—Olik Chaudhuri
Assistant Examiner—Kurt Eaton
(74) Attorney, Agent, or Firm—George O. Saile; Stephen B. Ackerman; Graham S. Jones, II

(57) ABSTRACT

This is a method of planarizing a surface of a photoresist layer formed above a layer formed over a gap in a blanket silicon nitride layer which in turn is formed above a keyhole in metallization with SOG layers therebetween on the surface of a semiconductor device. The following steps are performed. Form a blanket, first photoresist layer above the blanket silicon nitride with a damaged surface caused by the gap. Then strip the first photoresist layer leaving a residual portion of the first photoresist layer in the gap. Next, form a blanket, second photoresist layer above the blanket layer. The gap has a neck with a width from about 200 Å to about 500 Å and the gap has a deep, pocket-like cross-section with a width from about 500 Å to about 1,200 Å below the narrow neck. Partial stripping of the first photoresist layer, which follows, is performed by an etching process including wet and dry processing.

9 Claims, 2 Drawing Sheets

METHOD OF PREFILLING OF KEYHOLE AT THE TOP METAL LEVEL WITH PHOTORESIST TO PREVENT PASSIVATION DAMAGE EVEN FOR A SEVERE TOP METAL RULE

BACKGROUND OF THE INVENTION

1. Field of the Invention

This invention relates to the top metallization layer of a semiconductor memory device and more particularly to planarization of a passivation layer thereover.

2. Description of Related Art

In the backend process of manufacture of Enhanced Embedded DRAM (EDRAM) devices, we have found the passivation damage at a particular position. After gradually tracing the problem, the SOG gap-filling of passivation layer is the main issue and it causes the worst photoresist profile, therefore, the passivation damage is induced during etching of the passivation layer. We have concluded that the passivation damage results from a pocket or void which causes poor gap-filling above the SOG in the pocket regions. After passivation with a photoresist coating we have found by scanning with a alpha-stepper that the photoresist profile is not as flat and smooth as we anticipated. The poor gap filling is due to the density of metal lines which are formed in an array. The use of a thicker SOG layer did not help.

We have found that passivation damage is not avoidable for mask-sets for 0.35 EDRAM devices, (0.6 $\mu$m/0.6 $\mu$m) by using a current passivation scheme which is as follows:

Form M4-Fourth level Metallization

Form 15,000 Å SiON (PE SiON)

Deposit 3,000 Å SOG (Spin-On-Glass)

Form 10,000 Å SiN (Silicon Nitride)

Using such a process, the SOG layer is absorbed completely by the improper layout pattern (~4000 $\mu$m comb-meander) at the edge of a die. This permits or causes the photoresist to flow into the gap in a succeeding photoresist processing step which involves a soft bake. Thus there is damage during the passivation etch due to poor SOG planarization.

U.S. Pat. No. 4,778,739 of Protschka for "Photoresist Process for Reactive Ion Etching of Metal Patterns for Semiconductor Devices" shows a photoresist rework process for metal lines.

U.S. Pat. No. 5,665,657 of Lee for "Spin-On-Glass Partial Etchback Planarization Process" shows a method for forming a planarization SOG layer which eliminates voids in SOG layers in between closely spaced conductive lines, employing an etch back process.

U.S. Pat. No. 5,567,660 of Chen et al. for "Spin-On-Glass Planarization by a New Stagnant Coating Method" shows a gap fill method to fill gaps between metal lines which method differs from the present invention.

SUMMARY OF THE INVENTION

This invention adds a second photoresist step over a silicon nitride layer over a metallization (e.g., M4) layer.

Passivation damage is avoided everywhere including even a severe top metal rule with a about a 4000 $\mu$m comb-meander for an 8,000 Å metal height.

The result of the process of this invention is gap-filling and more particularly planarization of the passivation layer thereover.

In accordance with this invention, a method is provided for planarizing a surface of a photoresist layer formed above a layer formed over a gap in a blanket silicon nitride layer which in turn is formed above a keyhole in metallization with SOG layers therebetween on the surface of a semiconductor device.

The method includes the following steps.

Form a blanket, first photoresist layer above the blanket silicon nitride with a damaged surface caused by the gap in the silicon nitride layer.

Strip the first photoresist layer leaving a residual portion of the first photoresist layer in the gap.

Then, form a blanket, second photoresist layer above the blanket layer.

Preferably, the gap has a neck with a width of from about 200 Å to about 500 Å and the gap has a deep, pocket-like cross-section with a width from about 500 Å to about 1,200 Å below the narrow neck, and the partial stripping of the first photoresist layer is performed by an etching process including wet and dry processing.

In accordance with another aspect of the invention, a method is provided for planarizing a surface of a photoresist layer is formed above a layer formed over a gap in a blanket silicon nitride layer which in turn is formed above a keyhole in metallization with SOG layers therebetween on the surface of a semiconductor device, comprising the following steps.

Form a blanket, first photoresist layer above the blanket silicon nitride with a damaged surface caused by the gap.

Strip the first photoresist layer leaving a residual portion of the first photoresist layer in the gap, and Form a blanket, second photoresist layer above the blanket layer.

Preferably, in either aspect of the method of this invention, the partial stripping of the first photoresist layer is performed by an etching process. Preferably wet and dry processing is used in the etching process.

In accordance with still another aspect of this invention, a semiconductor device is covered with a blanket silicon nitride layer with a gap therein above a keyhole in metallization of the device. A gap filling first photoresist layer has been formed in the gap above the blanket layer with a damaged surface caused by the gap etched back to leave the first photoresist layer in the gap. A blanket, second photoresist layer is formed above the blanket layer. The first photoresist layer is coated on the silicon nitride and subjected to a soft bake prior to formation of the second photoresist layer which had been formed by coating, soft baking, exposure, developing and a hard baking.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
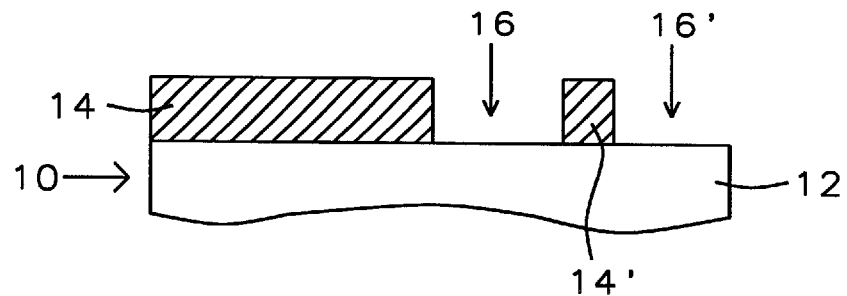
FIG. 1 shows a thin film memory device with a planar layer upon which is formed a top metallization layer patterned into a wide portion and a narrow tooth with a keyhole between the wide portion and narrow tooth and another opening to the right of narrow tooth.

FIG. 1 shows a thin film memory device 10 with a planar substrate layer 12 (composed of a material such as a dielectric) upon which is formed a top (M4) metallization layer (composed of a material selected from titanium nitride (TiN), tungsten (W), and aluminum copper (AlCu) with a thickness from about 6,000 Å to about 10,000 Å, which has been patterned into a wide planar metallization (M4) portion 14 and a narrow metallization (M4) tooth 14' to the right of the wide portion 14. There is a keyhole 16 between the wide portion 14 and narrow tooth 14' and another opening 16' to the right of narrow tooth 14'.

Figure 2:
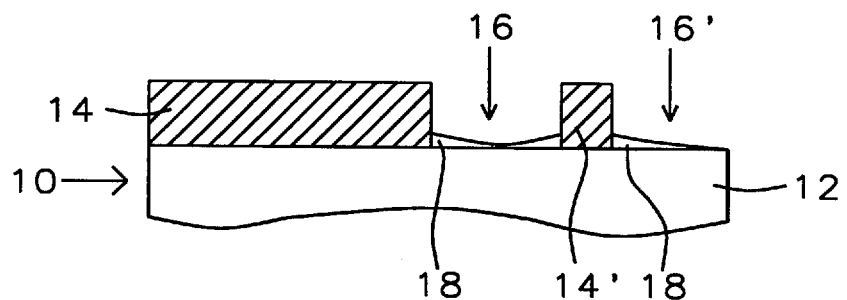
FIG. 2 shows the device of FIG. 1 after addition of a SOG layer filling the base of the keyhole and the bottom of opening covering the exposed surface of the substrate layer well below the top of the metallization portion and the top of the narrow tooth.

FIG. 2 shows the device 10 of FIG. 1 after addition of a SOG layer 18 filling the base of the keyhole 16 and the bottom of opening 16', covering the exposed surface of layer 12 to a thickness from about 500 Å to about 1500 Å. Thus, the SOG layer 18 is well below the top of the metallization portion 14 and the top of the narrow tooth 14'.

Figure 3:
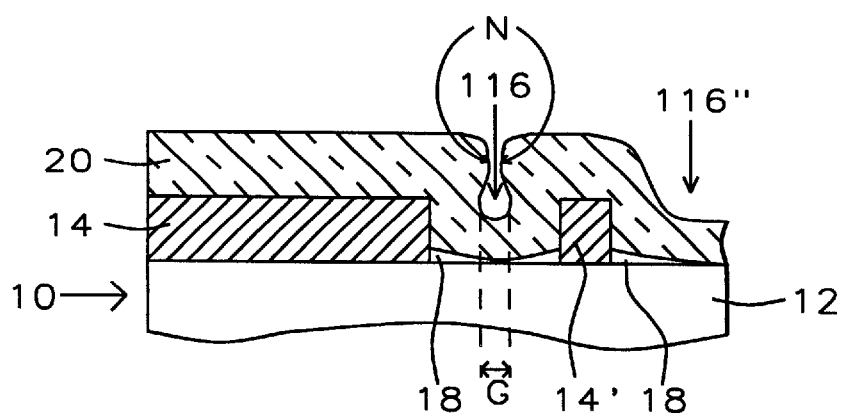
FIG. 3 shows the device of FIG. 2 after formation of a silicon nitride layer filling the keyhole further and the opening, covering the exposed surface of the SOG layer with a blanket silicon nitride layer. A deep, narrow hole is formed above the keyhole.

FIG. 3 shows the device 10 of FIG. 2 after formation of a silicon nitride passivation layer 20 which has a thickness from about 8,000 Å to about 12,000 Å. Passivation layer 20 fills the keyhole 16 further and also fills the opening 16', where it covers the exposed surface of SOG layer 18. Thus, the SOG layer 18 and the metallization portion/tooth 14/14' are covered by a blanket silicon nitride passivation layer 20. A deep, narrow hole 116 is formed above keyhole 16 and a wider hole 116' is formed above opening 16'. The dimensions of the narrow hole 116 over keyhole 16 are a narrow neck N with a wide gap G that is deeper, below the narrow neck N. Narrow neck N has a width from about 200 Å to about 500 Å. Wide gap G has a deep, pocket-like cross-section with a width from about 500 Å to about 1,200 Å below the narrow neck N.

Figure 4:
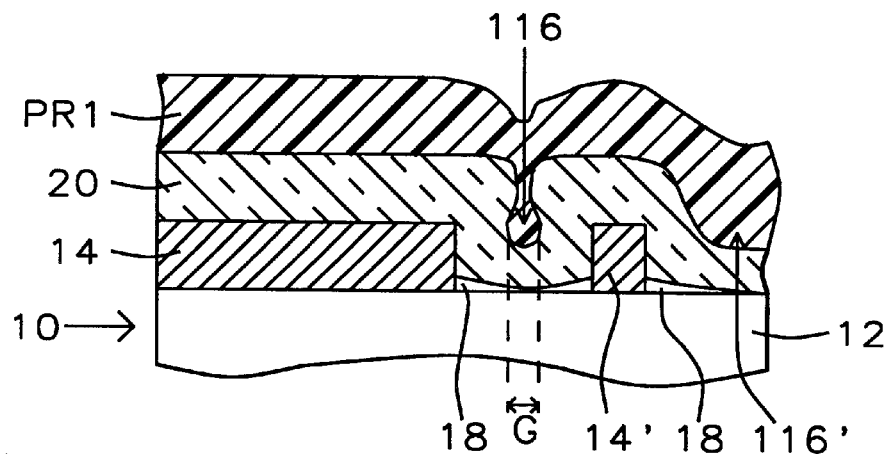
FIG. 4 shows the device of FIG. 3 after formation of a first, blanket, photoresist layer filling the narrow hole leaving a relatively sharp depression above the narrow hole, which is caused by the gap below the narrow neck. This results in a thinning of the photoresist layer at the site of the depression. This thinning is great enough to comprise damage which damages the effect of the passivation provided by the photoresist layer.

FIG. 4 shows the device 10 of FIG. 3 after formation of a first, blanket, photoresist layer PR1 with a thickness from about 0.7 μm to about 3.5 μm. First, blanket, photoresist layer PR1 fills the narrow hole 116 and wider hole 116" leaving a relatively sharp depression of from about 1.5 μm to about 3.5 μm above narrow hole 116, which is caused by the gap G below narrow neck N. This results in a thinning of the photoresist layer PR1 at the site of the depression D. This thinning is great enough to comprise damage which damages the effect of the passivation provided by the photoresist layer PR1. In place of the empty hole 116" shown in FIG. 3, a filled hole 116' is shown.

Figure 5:
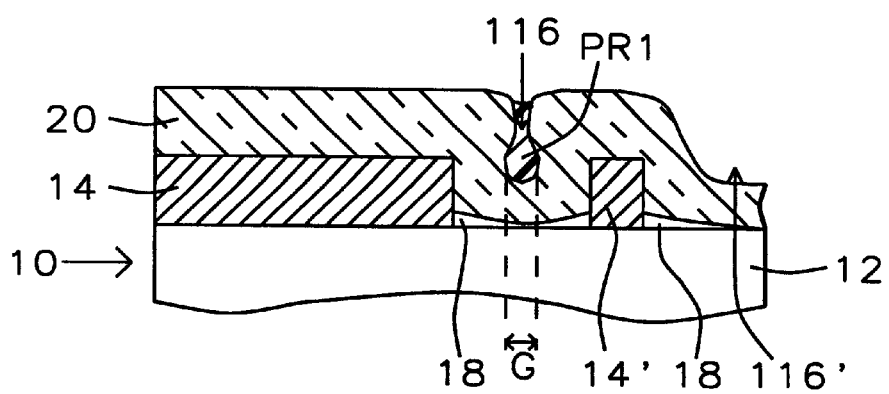
FIG. 5 shows the device of FIG. 4 after the first photoresist layer has been stripped in a wet and dry etching process with some residue of photoresist layer remaining in the key-hole filling the gap up into the neck, but the remainder of the top surface of silicon nitride layer is now exposed.

FIG. 5 shows the device 10 of FIG. 4 after first photoresist layer PR1 has been stripped in a wet and dry etching process with some residue of photoresist layer PR1 remaining in the key-hole 116 filling the gap G up into the neck N, but the remainder of the top surface of silicon nitride layer 20 is now exposed.

Figure 6:
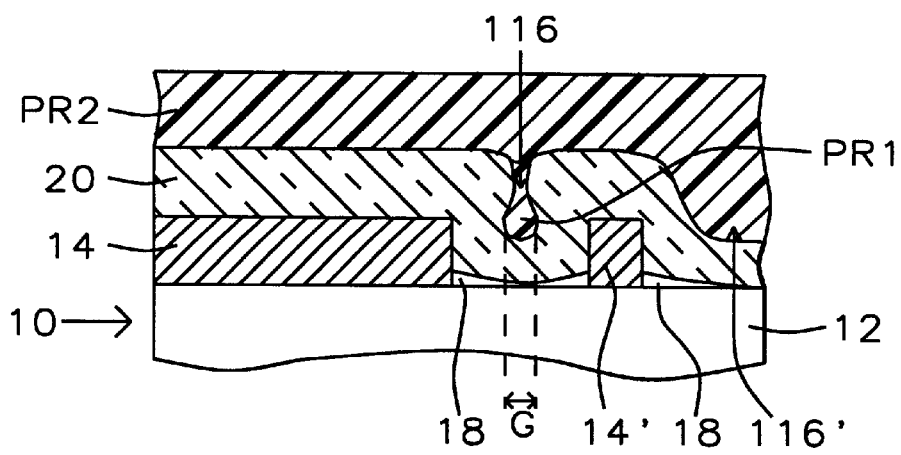
FIG. 6 shows the device of FIG. 5 after formation of a second blanket photoresist layer covering the surface of the silicon nitride layer and the remaining portion of the photoresist layer which substantially fills the gap up into the neck. The result is gap-filling and more particularly planarization of the passivation layer thereover.

FIG. 6 shows the device 10 of FIG. 5 after formation of a second blanket photoresist layer PR2 with a thickness from about 2.5 μm to about 3.5 μm covering the surface of silicon nitride layer 20 and the remaining portion of photoresist layer PR1 which substantially fills the gap G with resist PR1 reaching up into the neck N. Inspection of the results of the second photoresist step shows substantially no resist filling into key-hole as evidenced by OM (Optical Microscopy) inspection. Thus, passivation damage is avoided, i.e. the device is free from such damage. The result is that the gap is filled and more particularly planarization of the passivation layer thereover has been achieved.

There is a soft bake step next. The "second photoresist layer" (PR2) includes a photoresist (PR) coating, soft bake, exposure, developing and a hard bake; but the "first photoresist layer" (PR1) includes a photoresist (PR) coating and soft bake.

Next, the passivation bubble is removed by a PSC $O_2$ plasma etcher just after alloying to remove photoresist by means of a plasma dry etch.

The passivation bubble is photoresist (PR) remaining after passivation of the photoresist (PR) which will become a bubble during passivation alloying of the metal layer and the contact. Only the remainder of the photoresist layer PR1 in the gap G will become the passivation bubble.

SUMMARY OF PROCESS

1. A first photoresist coating fills the key-hole induced by not enough SOG filling.

2. Strip the first photoresist coating with a wet and dry process leaving some photoresist residue in the key-hole.

3. Then coat the device in a second photoresist step (actually passivation photolithography) with no substantial photoresist filling into key-hole as determined by OM (Optical Microscopy) inspection, so passivation damage is thus avoided after subsequent passivation etching due to the good photoresist planarization, i.e. the device is free of such damage.

4. Remove the passivation bubble by PSC or plasma etching just after alloying.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method comprising the steps as follows:
    form a thin glass layer filling only the base of a keyhole formed between portions of metallization formed over a surface of a semiconductor device, form a blanket layer of silicon nitride passivation material covering said metallization, said keyhole and said thin glass layer in said keyhole, said blanket layer of silicon nitride passivation material having a deep narrow hole formed therein with a narrow neck and a wide gap deeper in said blanket layer of material (20) above said keyhole, form a blanket, first photoresist layer above said blanket layer of silicon nitride passivation material with a relatively sharp depression therein above said keyhole caused by said gap, partially stripping said first photoresist layer in a wet and dry etching process leaving a residual portion of said first photoresist layer in said gap with some residue of the first photoresist layer remaining in said gap, and form a blanket, second photoresist layer above said blanket layer of silicon nitride passivation material, thereby providing a planarized surface on said second photoresist layer, exposure, develop, and bake, whereby the surface of the silicon nitride passivation material is planarized with photoresist.

2. A method in accordance with claim 1 wherein:

said gap has a neck with a width from about 200 Å to about 500 Å and said gap has a deep, pocket-like cross-section with a width from about 500 Å to about 1,200 Å below said narrow neck.

3. A method in accordance with claim 1 wherein said gap has a neck with a width from about 200 Å to about 500 Å and said gap has a deep, pocket-like cross-section with a width from about 500 Å to about 1,200 Å below said narrow neck.

4. A method of planarizing a surface of a photoresist layer formed above a layer formed over a gap in a blanket silicon nitride passivation layer which in turn is formed above a keyhole in metallization with a thin glass layer therebetween on the surface of a semiconductor device, comprising the steps as follows:

form said thin glass layer only in said keyhole located only well below the top of the metallization, form said blanket silicon nitride passivation layer covering said metallization and said keyhole, said blanket silicon nitride passivation layer having a deep narrow hole formed therein with a narrow neck and a wide gap formed deep in said blanket silicon nitride passivation layer above said keyhole, form a blanket, first photoresist layer above said blanket silicon nitride passivation layer with a relatively sharp depression therein above said keyhole caused by said gap, partially strip said first photoresist layer in a wet and dry etching process leaving a residual portion of said first photoresist layer in said gap, and form a blanket, second photoresist layer above said blanket silicon nitride passivation layer and perform a soft bake, an exposure, a developing step, and a hard bake of the second photoresist layer, thereby providing a planarized surface on said second photoresist layer.

5. A method in accordance with claim 4 wherein:

said gap has a neck with a width from about 200 Å to about 500 Å and said gap has a deep, pocket-like cross-section with a width from about 500 Å to about 1,200 Å below said narrow neck.

6. A method in accordance with claim 4 wherein said gap has a neck with a width from about 200 Å to about 500 Å and said gap has a deep, pocket-like cross-section with a width from about 500 Å to about 1,200 Å below said narrow neck.

7. A method of planarizing a surface of a photoresist layer formed above a layer formed over a gap in a blanket silicon nitride passivation layer which in turn is formed above a keyhole in metallization, the metallization having a top, with a SOG (Spin on Glass) film therebetween on the surface of a semiconductor device, comprising the steps as follows:

form said thin SOG film only at the bottom of said keyhole, well below the top of the metallization, form said blanket silicon nitride passivation layer covering said metallization and of the semiconductor device and said SOG in said keyhole, said blanket silicon nitride passivation layer having a deep narrow hole formed therein with a narrow neck and a wide gap formed deep in said blanket silicon nitride passivation layer above said keyhole, form a blanket, first photoresist layer above said blanket silicon nitride passivation layer with a relatively sharp depression therein above said keyhole caused by said gap, partially strip said first photoresist layer in a wet and dry etching process leaving a residual portion of said first photoresist layer in said gap, and form a blanket, second photoresist layer above said blanket slicon nitride passivation layer and perform a soft bake, an exposure, a developing step, and a hard bake of the second photoresist layer, thereby providing a planarized surface on said passivation layer provided by said first and said second photoresist layers.

8. The method of claim 7 wherein said gap has a neck with a width from about 200 Å to about 500 Å and said gap has a deep, pocket-like cross-section with a width from about 500 Å to about 1,200 Å below said narrow neck.

9. The method of claim 7 wherein said gap has a neck with a width from about 200 Å to about 500 Å and said gap has a deep, pocket-like cross-section with a width from about 500 Å to about 1,200 Å below said narrow neck.

* * * * *